(12) United States Patent
Lee et al.

(10) Patent No.: US 10,459,565 B2
(45) Date of Patent: Oct. 29, 2019

(54) DISPLAY DEVICE HAVING INTEGRATED TOUCH SENSING COMPONENTS

(71) Applicant: Samsung Display Co., Ltd, Yongin-si, Gyeonggi-do (KR)

(72) Inventors: Mi Sun Lee, Yongin-si (KR); Hong Jo Park, Yongin-si (KR)

(73) Assignee: Samsung Display Co., Ltd. (KR)

( * ) Notice: Subject to any disclaimer, the term of this patent is extended or adjusted under 35 U.S.C. 154(b) by 57 days.

(21) Appl. No.: 15/262,940

(22) Filed: Sep. 12, 2016

(65) Prior Publication Data

US 2017/0205934 A1     Jul. 20, 2017

(30) Foreign Application Priority Data

Jan. 20, 2016   (KR) .......................... 10-2016-0006907

(51) Int. Cl.
*G02F 1/1343*    (2006.01)
*G02F 1/1362*    (2006.01)
(Continued)

(52) U.S. Cl.
CPC .......... *G06F 3/0416* (2013.01); *G02F 1/1368* (2013.01); *G02F 1/13338* (2013.01);
(Continued)

(58) Field of Classification Search
CPC ........ G06F 3/044; G06F 3/041; G06F 3/0412; G06F 2203/04103; G06F 2203/04111; G02F 1/13338; G02F 1/136286; G02F 1/133514; G02F 1/1333; G02F 1/134336; G02F 2201/123; G02F 1/136227; G02F 1/1676; G02F 1/133512; G02F 1/133345; G02F 1/133707; G02F 1/1362;
(Continued)

(56) References Cited

U.S. PATENT DOCUMENTS 7,889,183 B2 *   2/2011   Lee ..................... G02F 1/13338
                                               345/173
8,427,594 B2 *   4/2013   Kim .................. G02F 1/134309
                                               349/151
(Continued)

FOREIGN PATENT DOCUMENTS

JP            5583187 B2     7/2014
KR       10-1318448 B1      10/2013
(Continued)

*Primary Examiner* — Dismery Mercedes
(74) *Attorney, Agent, or Firm* — Innovation Counsel LLP

(57) ABSTRACT

A display device includes a plurality of gate lines; a plurality of data lines; a plurality of thin film transistors each connected to one of the gate lines and one of the data lines; a plurality of pixels each including a first electrode and a second electrode insulated from the first electrode and connected to one of the thin film transistors, the pixels arranged in a plurality of pixel rows and a plurality of pixel columns; and a plurality of sensing lines connected to the first electrodes. The gate lines include front gate lines and rear gate lines arranged at a front and a rear of each of the respective pixel rows, and a rear gate line of a front pixel row and a front gate line of a rear pixel row are arranged between adjacent pixel rows, and two pixel columns are arranged between adjacent data lines.

39 Claims, 12 Drawing Sheets

(51) Int. Cl.
  *H01L 27/12* (2006.01)
  *G06F 3/044* (2006.01)
  *G06F 3/041* (2006.01)
  *G02F 1/1333* (2006.01)
  *G02F 1/1368* (2006.01)

(52) U.S. Cl.
  CPC .. *G02F 1/133345* (2013.01); *G02F 1/134336* (2013.01); *G02F 1/136227* (2013.01); *G02F 1/136286* (2013.01); *G06F 3/044* (2013.01); *G06F 3/0412* (2013.01); *H01L 27/124* (2013.01); *G02F 2001/136222* (2013.01); *G06F 2203/04111* (2013.01)

(58) Field of Classification Search
  CPC .......... G02F 2001/136222; G02F 2001/13629; H01L 29/7869; H01L 29/78606; H01L 29/4908; H01L 27/124; H01L 27/1214; H01L 27/3262; H01L 27/3276; H01L 27/12; H01L 29/41733; H01L 29/42384
  See application file for complete search history.

(56) References Cited

U.S. PATENT DOCUMENTS

| | | | | |
|---|---|---|---|---|
| 8,581,253 | B2* | 11/2013 | Bang | G02F 1/136209 257/59 |
| 8,994,673 | B2 | 3/2015 | Hwang et al. | |
| 9,151,994 | B2* | 10/2015 | Chang | G02F 1/134309 |
| 9,366,897 | B2* | 6/2016 | Choi | G02F 1/13338 |
| 9,448,656 | B2* | 9/2016 | Xu | G06F 3/0412 |
| 9,449,992 | B2* | 9/2016 | Kim | G02F 1/136209 |
| 9,530,341 | B2* | 12/2016 | Cheng | H01L 27/12 |
| 9,703,163 | B2* | 7/2017 | Tsuda | G02F 1/13338 |
| 9,835,915 | B2* | 12/2017 | Kim | G02F 1/136227 |
| 9,910,530 | B2* | 3/2018 | Aoyama | G06F 3/0416 |
| 9,939,942 | B2* | 4/2018 | Kuo | G06F 3/0412 |
| 2007/0035675 | A1* | 2/2007 | Um | G02F 1/134363 349/43 |
| 2007/0046650 | A1* | 3/2007 | Lee | G02F 1/13338 345/173 |
| 2009/0225267 | A1* | 9/2009 | Atarashiya | G02F 1/134363 349/139 |
| 2009/0295701 | A1* | 12/2009 | Matsumoto | H01L 29/41733 345/92 |
| 2010/0073617 | A1* | 3/2010 | Han | G02F 1/136286 349/143 |
| 2010/0296015 | A1* | 11/2010 | Kim | G02F 1/134309 349/37 |
| 2011/0102309 | A1* | 5/2011 | Cho | G09G 3/3648 345/92 |
| 2011/0157039 | A1* | 6/2011 | Shin | G02F 1/13338 345/173 |
| 2011/0310035 | A1* | 12/2011 | Kim | G06F 3/0412 345/173 |
| 2012/0038585 | A1* | 2/2012 | Kim | G06F 3/0412 345/174 |
| 2013/0120680 | A1* | 5/2013 | Sun | G02F 1/1368 349/43 |
| 2013/0127698 | A1* | 5/2013 | Chang | G02F 1/134309 345/100 |
| 2013/0321736 | A1* | 12/2013 | Jang | G02F 1/136286 349/46 |
| 2013/0328812 | A1* | 12/2013 | Kim | G06F 3/044 345/173 |
| 2013/0328855 | A1* | 12/2013 | Li | G09G 3/3696 345/212 |
| 2014/0054624 | A1* | 2/2014 | Chen | H01L 27/156 257/89 |
| 2014/0062941 | A1* | 3/2014 | Park | G06F 3/0412 345/174 |
| 2014/0070221 | A1* | 3/2014 | Li | H01L 29/78669 257/59 |
| 2014/0118299 | A1* | 5/2014 | Wang | G06F 3/0416 345/174 |
| 2014/0152922 | A1* | 6/2014 | Bae | G02F 1/133711 349/15 |
| 2014/0160066 | A1 | 6/2014 | Kim et al. | |
| 2014/0320767 | A1 | 10/2014 | Xu et al. | |
| 2015/0009443 | A1* | 1/2015 | Song | G02F 1/136 349/43 |
| 2015/0268762 | A1* | 9/2015 | Wang | G06F 3/0412 345/174 |
| 2016/0027356 | A1* | 1/2016 | Cheng | H01L 27/12 345/173 |
| 2016/0246425 | A1* | 8/2016 | Liu | G06F 3/044 |
| 2016/0299614 | A1* | 10/2016 | Yang | G06F 3/044 |
| 2016/0306202 | A1* | 10/2016 | Lee | G02F 1/133377 |
| 2017/0108746 | A1* | 4/2017 | Jang | G02F 1/134309 |
| 2017/0176803 | A1* | 6/2017 | Sonoda | G02F 1/13306 |
| 2017/0285386 | A1* | 10/2017 | Ono | G02F 1/13394 |
| 2018/0143711 | A1* | 5/2018 | Ono | G06F 3/044 |

FOREIGN PATENT DOCUMENTS

| | | |
|---|---|---|
| KR | 10-1609485 B1 | 4/2016 |
| KR | 10-2017-0026919 A | 3/2017 |

* cited by examiner

DISPLAY DEVICE HAVING INTEGRATED TOUCH SENSING COMPONENTS

RELATED APPLICATIONS

The present application claims priority under 35 U.S.C. 119(a) to Korean Patent Application No. 10-2016-0006907 filed on Jan. 20, 2016 in the Korean Intellectual Property Office, the entire contents of which are incorporated herein by reference in their entirety.

BACKGROUND

Field

An aspect of the present disclosure relates generally to a display device. More specifically, an aspect of the present disclosure relates to a display device with integrated touch sensing components.

Description of the Related Art

Conventional touch-sensitive display devices typically include a touch screen attached to a display panel. The touch screen can be considered an information input device. A user watches an image created in the display panel and inputs information by pressing or touching a touch sensor in the touch screen.

Recent efforts have focused on developing a touch-sensitive display device for a slim portable terminal, for example, a smartphone and a tablet PC.

SUMMARY

According to an aspect of the present disclosure, there is provided a touch screen integrated with a display device in which elements constituting the touch screen are arranged within, i.e. integrated into, the display panel.

According to an embodiment, the display device may include a plurality of gate lines, a plurality of data lines intersecting the gate lines, a plurality of thin film transistors each connected to one of the gate lines and one of the data lines, a plurality of pixels each including a first electrode and a second electrode insulated from the first electrode and connected to one of the thin film transistors, the pixels arranged in a matrix configuration including a plurality of pixel rows extending parallel with the gate lines and a plurality of pixel columns extending parallel with the data lines, and a plurality of sensing lines connected to the first electrodes. The gate lines include front gate lines and rear gate lines arranged at a front and a rear of each of the respective pixel rows, and a rear gate line of a front pixel row and a front gate line of a rear pixel row are arranged between adjacent pixel rows, and two pixel columns are arranged between adjacent data lines.

The sensing lines may be oriented substantially parallel with at least one of the data lines and the gate lines.

The sensing lines may be oriented substantially parallel with the data lines and each arranged between two adjacent pixel columns. The sensing lines and the gate lines may be alternately arranged.

The sensing lines may be oriented substantially parallel with the gate lines. Ones of the sensing lines may be arranged between the rear gate line in each front pixel row and the front gate line in the adjacent rear pixel row.

The sensing lines may comprise a first sensing line oriented parallel with the gate lines and a second sensing line connected to the first sensing line and oriented parallel with the data lines. The first sensing line may be arranged between the rear gate line in one of the front pixel rows and the front gate line of the corresponding rear pixel row. The second sensing lines may be arranged on a same layer as the data lines and arranged between adjacent pixel columns.

The second electrode may comprise a plurality of branch units arranged and spaced apart from one another, and connecting units connecting both sides of the branch units.

The second electrode may comprise a first electrode unit and a second electrode unit arranged on opposing sides of an imaginary reference line, and the first electrode unit and the second electrode unit may each comprise a plurality of branch units and a connecting unit connecting at least one side of the branch units.

The branch units of the first electrode unit and the branch units of the second electrode unit may extend in a direction inclined with respect to the reference line. The first electrode unit and the second electrode unit may have an edge inclined with respect to the reference line.

The data lines and the sensing lines may comprise a first portion oriented corresponding to the first electrode unit and a second portion oriented corresponding to the second electrode. The data lines and the sensing lines may further comprise a straight line unit oriented substantially perpendicular to at least one of the gate lines.

A first electrode may comprise the sensing electrodes covering a plurality of pixel regions. Sides of the sensing electrodes may be oriented substantially parallel to corresponding sides of corresponding data lines.

The sensing electrodes may at least partially overlap the data lines.

A distance between adjacent sensing electrodes may be smaller than a width of the data lines.

In addition, a display device may comprise a first substrate including a base substrate, a plurality of gate lines arranged on the base substrate, a plurality of data lines intersecting the gate lines, a plurality of sensing lines arranged on a same layer as at least one of the gate lines and the data lines, and a plurality of thin film transistors connecting to respective ones of the gate lines and ones of the data lines, a second substrate opposite to the first substrate, and a plurality of pixels arranged in a matrix configuration including a plurality of pixel rows oriented substantially parallel with the gate lines and a plurality of pixel columns oriented substantially parallel with the data lines, the pixels being positioned between the first substrate and the second substrate. Each of the pixels comprises a first electrode connected to one of the sensing lines, an electrode insulating layer arranged on the first electrode, a second electrode arranged on the electrode insulating layer and connected to one of the thin film transistors, and an optical layer between the first electrode and the second electrode. The gate lines include front gate lines and rear gate lines arranged at a front and a rear of each of the respective pixel rows, and a rear gate line of a front pixel row and a front gate line of a rear pixel row are arranged between adjacent pixel rows, and two pixel columns are arranged between adjacent data lines.

The second electrode may include a plurality of branch units arranged and spaced apart from one another, and connecting units connecting both sides of the branch units.

DETAILED DESCRIPTION

Hereinafter, exemplary embodiments of the present disclosure will be described in detail with reference to the accompanying drawings. The various Figures may not be to scale. All numerical values are approximate, and may vary. All examples of specific materials and compositions are to be taken as nonlimiting and exemplary only. Other suitable materials and compositions may be used instead.

Figure 1:
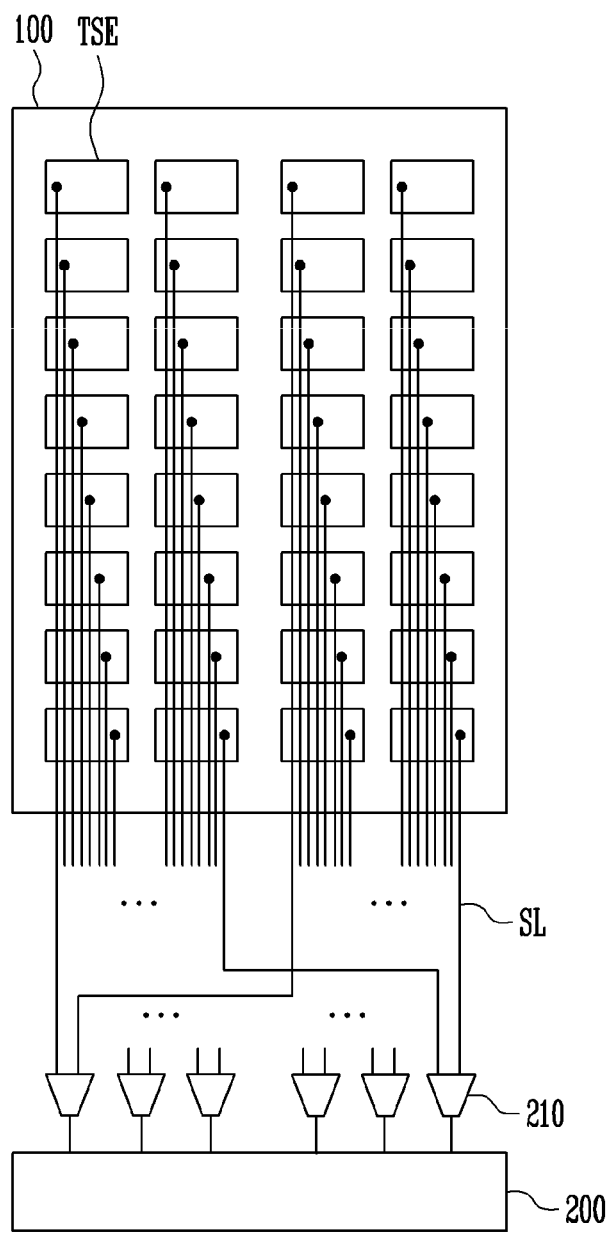
FIG. 1 is a plan view illustrating a display device according to an embodiment of the present disclosure.

FIG. 1 is a plan view illustrating a display device according to an embodiment of the present disclosure.

Referring to FIG. 1, the display device may include a display panel 100 and a touch driving unit 200.

A touch screen (not shown) may be included in the display panel 100, and the touch screen may sense a touch position from a user. The display panel 100 may include a first substrate (not shown), a second substrate (not shown), and a plurality of pixels arranged between the first substrate and the second substrate, as is known. One of the first and second substrates may include a plurality of gate lines, a plurality of data lines intersecting the gate lines, and a plurality of thin film transistors connected to the gate lines and the data lines. Each pixel may connect to one of the thin film transistors.

The pixel may be, for example, one pixel of a liquid crystal display device, a pixel of an electrophoretic display device, a pixel of an electrowetting display device, or a pixel of an organic light emitting display device. According to an embodiment of the present disclosure, for convenience of explanation, the pixel may be a pixel of a liquid crystal display device. In addition, although not shown, the pixel may display an image by using light provided from a backlight unit.

The pixel may include a first electrode, a second electrode and a liquid crystal layer transmitting the light by an electric field which the first and second electrodes form. One of the first and second electrodes, for example the second electrode, may connect to the thin film transistor and receive a driving signal.

One of the first and second electrodes, for example the first electrode, may receive a common voltage signal to form the electric field together with the second electrode. In addition, the first electrode may include a plurality of electrode patterns patterned to cover a plurality of pixel regions. The pixels may be arranged in the pixel regions. In addition, the electrode patterns may be sensing electrodes TSE of the touch screen. That is, the first electrode may include a plurality of sensing electrodes TSE.

The sensing electrodes TSE may each have a polygon shape, for example, a square shape. In addition, the sensing electrodes TSE may connect to the touch driving unit 200 through sensing lines SL. Therefore, the sensing electrodes TSE may sense the touch position of the user when a touch scan signal is applied through the sensing lines SL.

The sensing lines SL may transmit the touch scan signals applied from the touch driving unit 20 to the sensing electrodes TSE. In addition, the sensing lines SL may transmit a touch sensing signal received from the sensing electrode TSE, for example a change of capacitance, to the touch driving unit 200.

The touch driving unit 200 may generate the touch scan signals to sense a touch, and transmit the signals to the sensing electrodes TSE. A switching unit 210 arranged between the touch driving unit 200 and the display panel 100 may switch the touch scan signals transmitted to the sensing electrodes TSE.

Figure 2:
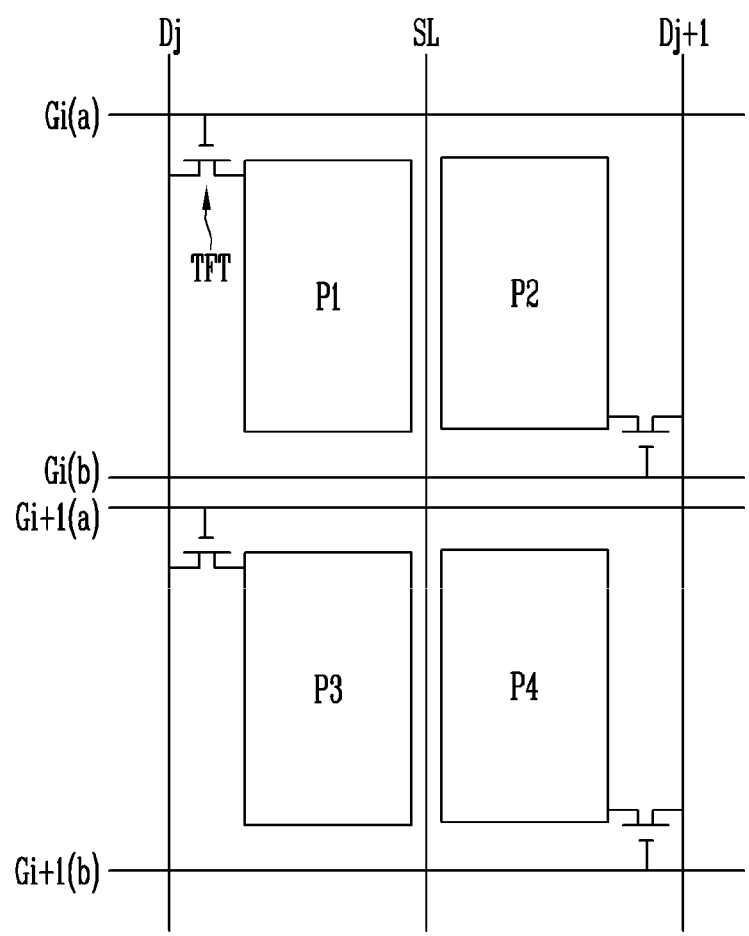
FIG. 2 is a conceptual view enlarging a portion of a region in which sensing electrodes in FIG. 1 are arranged.

FIG. 2 is a conceptual view enlarging a portion of a region in which sensing electrodes in FIG. 1 are arranged.

Referring to FIGS. 1 and 2, the display panel 100 may include a plurality of gate lines Gi(a), Gi(b), Gi+1(a) and Gi+1(b), a plurality of data lines the Dj and Dj+1 intersecting the gate lines Gi(a), Gi(b), Gi+1(a) and Gi+1(b), and sensing lines SL in parallel with the data lines Dj and Dj+1. Also included are thin film transistors TFT connecting the gate lines Gi(a), Gi(b), Gi+1(a) and Gi+1(b) and the data lines Dj and Dj+1, as well as a plurality of pixels P1, P2, P3 and P4 arranged in a plurality of pixel columns and a plurality of pixel rows. A plurality of pixels P1, P2, P3 and P4 may connect to the thin film transistors TFT, respectively.

The gate lines Gi(a), Gi(b), Gi+1(a) and Gi+1(b) may include front gate lines Gi(a) and Gi+1(a), and rear gate lines Gi(b) and Gi+1(b) arranged respectively at the front and the rear of each pixel row. Further, a rear gate line in a front pixel row and a front gate line in a rear pixel row may be arranged between these adjacent pixel rows. For example, the rear gate line Gi(b) in an ith (i is a natural number) pixel row and the front gate line Gi+1(a) in an (i+1)th pixel row may both be arranged between the ith pixel row and the (i+1)th pixel row.

Two pixel rows may be arranged between the adjacent data lines Dj and Dj+1.

One of the sensing lines SL may be arranged between adjacent data lines Dj and Dj+1. One of the sensing lines SL may be arranged between two adjacent pixel rows and between adjacent data lines Dj and Dj+1. For example, one of the sensing lines SL may be arranged between a jth (j is a natural number) pixel column and a (j+1)th pixel column. In addition, the sensing lines SL and the data lines Dj and Dj+1 may alternately arranged.

In more detail, the pixels P1, P2, P3 and P4 may include a first pixel P1 and a second pixel P2 adjacent to each other and arranged in the ith pixel row, and a third pixel P3 and a fourth pixel P4 adjacent to each other and arranged in the (i+1)th pixel row. The first pixel P1 and the third pixel P3 may be adjacent to each other in a column direction, and arranged in a jth pixel column. The first pixel P1 and the third pixel P3 may both be electrically connected to the data line Dj arranged in the jth pixel column. In addition, the second pixel P2 and the fourth pixel P4 may be adjacent to each other in the column direction, and arranged in the (j+1)th pixel column. Accordingly, the second pixel P2 and the fourth pixel P4 may be electrically connected to the data line Dj+1 arranged in the (j+1)th pixel column.

The front gate line Gi(a) arranged in the ith pixel row may be electrically connected to the first pixel P1, and the rear gate line Gi(b) arranged in the ith pixel row may be electrically connected to the second pixel P2. The front gate line Gi+1(a) arranged in the (i+1)th pixel row may be electrically connected to the third pixel P3, and the rear gate line Gi+1(b) arranged in the (i+1)th pixel row may be electrically connected to the fourth pixel P4. The rear gate line Gi(b) arranged in the ith pixel row and the front gate line Gi+1(a) arranged in the (i+1)th pixel row may be adjacent to each other.

In addition, the first pixel P1 and the third pixel P3 may be arranged on a left side of the sensing line SL, the second pixel P2 and the fourth pixel P4 may be arranged on a right side of the sensing line SL.

When a gate signal is applied to the front gate line Gi(a), a driving signal is applied to the data line Dj in the jth pixel column, and a common voltage signal is applied to the sensing line SL, the first pixel P1 may transmit light.

When the gate signal is applied to the rear gate line Gi(b), the driving signal is applied to the data line Dj+1 in the (j+1)th pixel column, and the common voltage signal is applied to the sensing line SL, the second pixel P2 may transmit light.

When the gate signal is applied to the rear gate line Gi+1(a), the driving signal is applied to the data line Dj in the jth pixel column, and the common voltage signal is applied to the sensing line SL, the third pixel P3 may transmit light.

When the gate signal is applied to the rear gate line Gi+1(b), the driving signal is applied to the data line Dj+1 in the (j+1) th pixel column, and the common voltage signal is applied to the sensing line SL, the fourth pixel P4 may transmit light.

Figure 3:
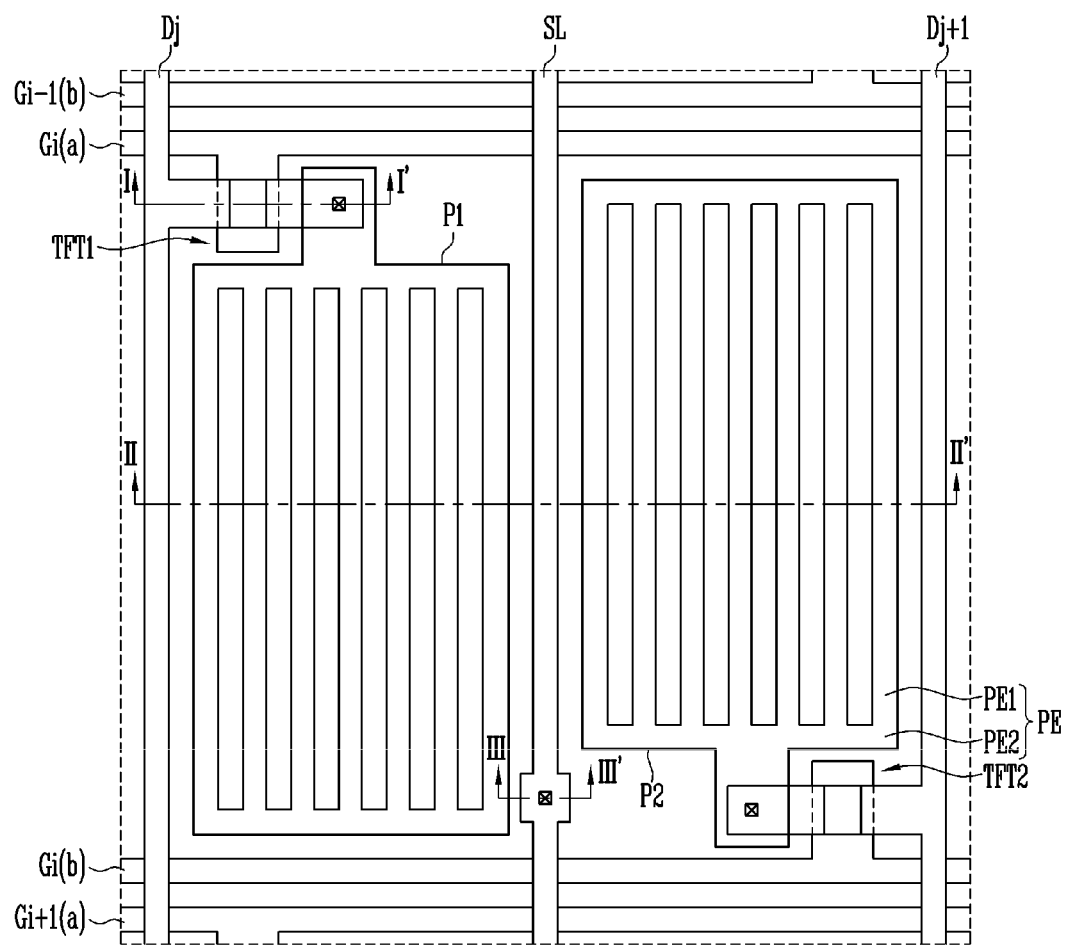
FIGS. 3, 4, and 5 are plan views illustrating two pixels arranged on a same row and adjacent to each other, gate lines and data lines connecting to the two pixels, and a sensing line.
Figure 4:
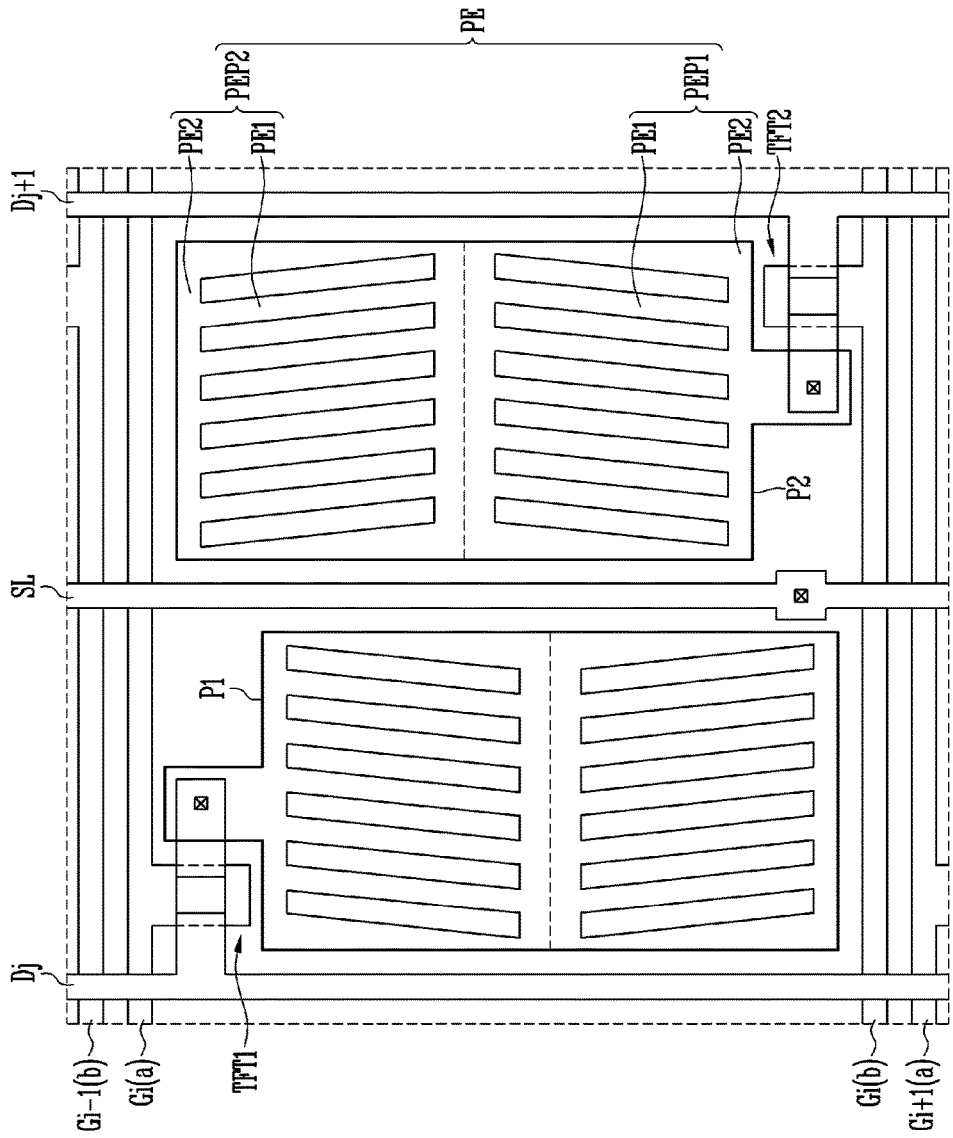
Figure 5:
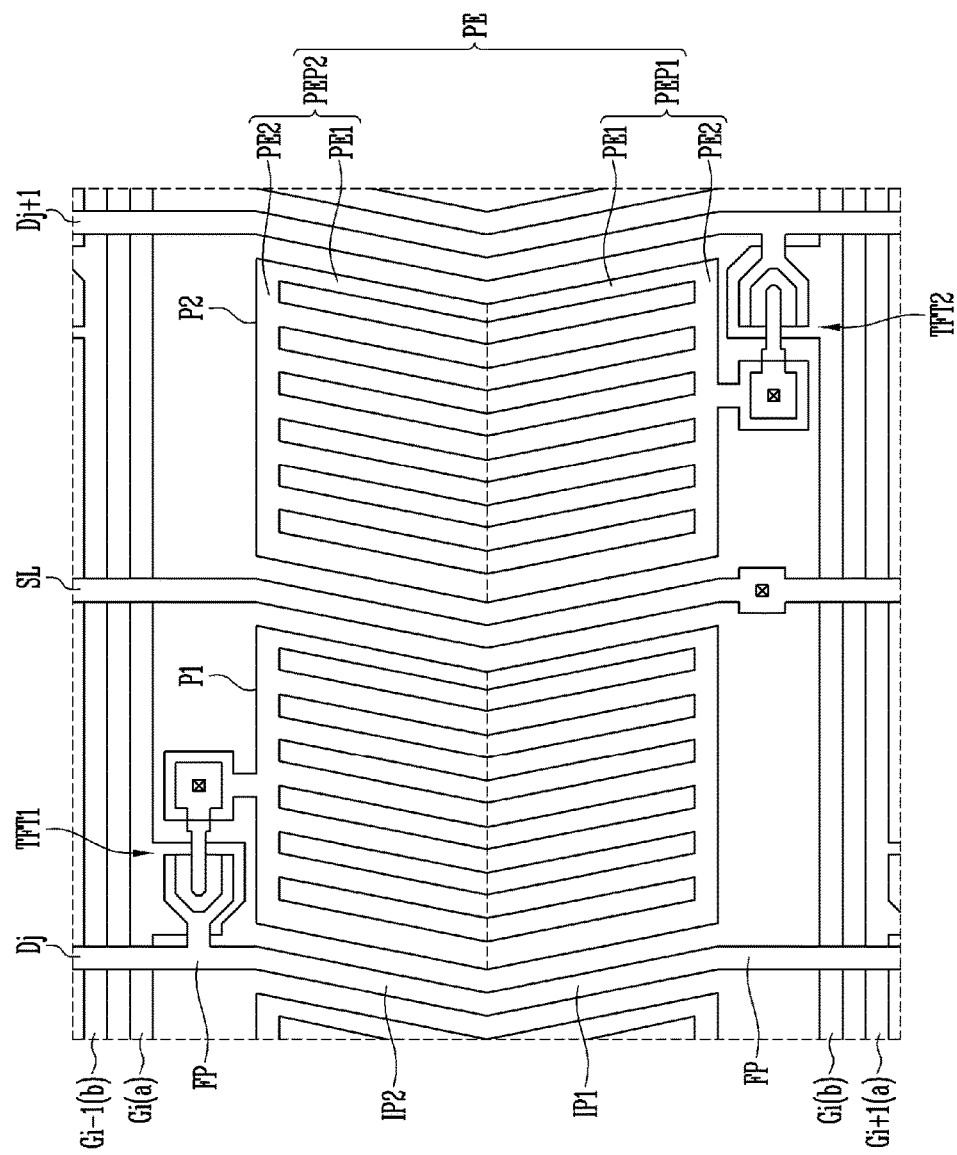
Figure 6:
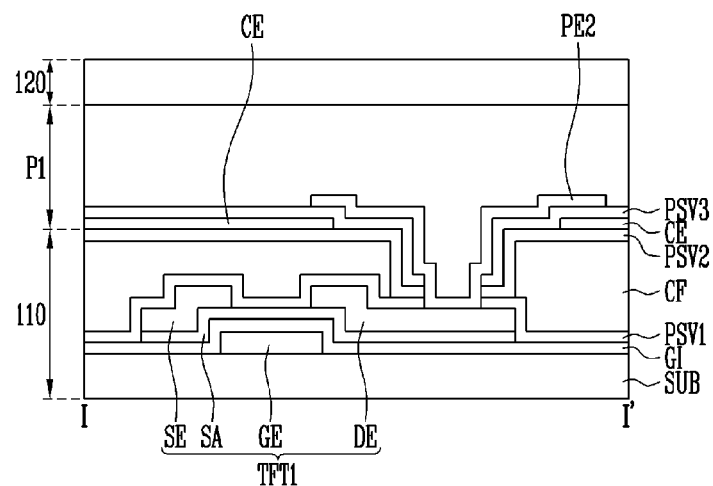
FIG. 6 is a cross sectional view taken along line I-I' in FIG. 3.
Figure 7:
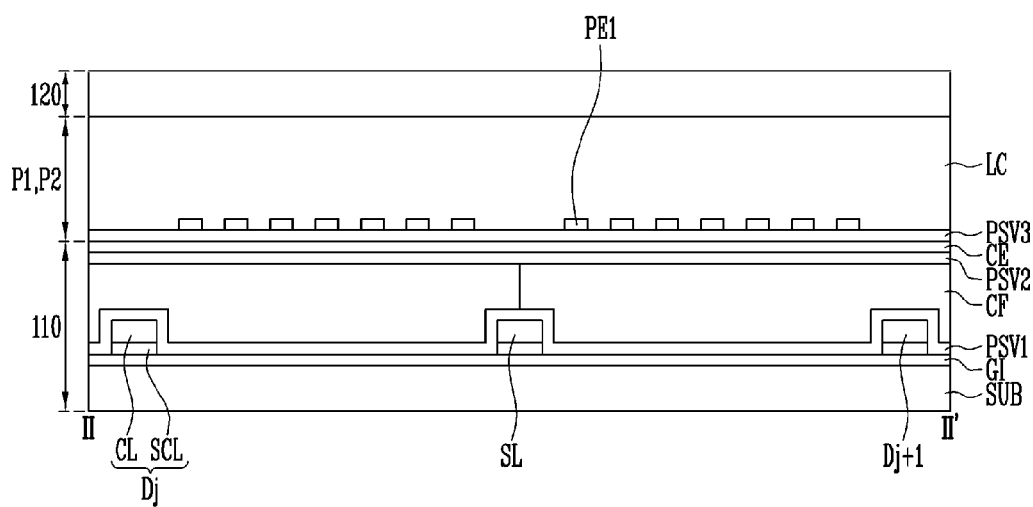
FIG. 7 is a cross sectional view taken along line II-II' in FIG. 3.
Figure 8:
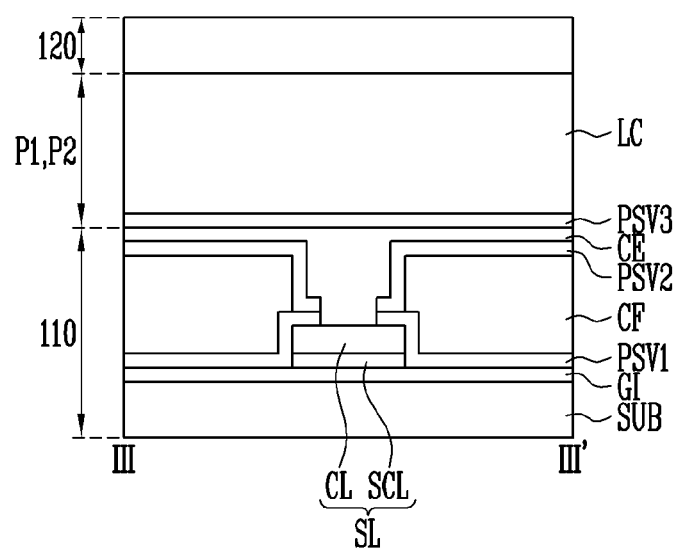
FIG. 8 is a cross sectional view taken along line in FIG. 3.

FIGS. 3 to 5 are plan views illustrating two pixels arranged in the same row and adjacent to each other, gate lines and data lines connecting two pixels, and a sensing line. FIG. 6 is a cross sectional view taken along line I-I' in FIG. 3, FIG. 7 is a cross sectional view taken along line II-II' in FIG. 3, and FIG. 8 is a cross sectional view taken along line in FIG. 3.

Referring to FIGS. 1 to 8, the display panel 100 may include a first substrate 110, a second substrate 120 opposite to the first substrate 110, and the plurality of pixels P1 and P2 arranged between the first substrate 110 and the second substrate 120. The first pixel P1 and the second pixel P2 may be arranged in the same pixel row.

The first substrate 110 may include a base substrate SUB, and thin film transistors TFT1 and TFT2 arranged on the base substrate SUB. The thin film transistors TFT1 and TFT2 may include a first thin film transistor TFT1 connecting the first pixel P1, and a second thin film transistor TFT2 connecting the second pixel P2.

The base substrate SUB1 may include insulating material, and may transmit light. The base substrate SUB may be a rigid substrate or a flexible substrate. The rigid substrate may include a glass substrate, a quartz substrate, a glass ceramic substrate and/or a crystalline glass substrate. The flexible substrate may include a film substrate and/or a plastic substrate comprising a polymer organic material. In addition, the flexible substrate may include fiber glass reinforced plastic (FRP).

It is desirable that a material used for the base substrate SUB has resistance (or heat resistance) against high processing temperature during a manufacturing process.

The plurality of gate lines Gi−1(b), Gi(a), Gi(b) and Gi+1(a) and the plurality of data lines Dj and Dj+1 intersecting the gate lines Gi−1(b), Gi(a), Gi(b) and Gi+1(a) may be arranged on the base substrate SUB.

The gate lines may include the front gate lines Gi(a) and Gi+1(a) and the rear gate lines Gi−1(b) and Gi(b) arranged in the same pixel row.

The first thin film transistor TFT1 and the second thin film transistor TFT2 may each connect to one of the gate lines Gi−1(b), Gi(a), Gi(b) and Gi+1(a) and one of the data lines Dj and Dj+1, respectively. For example, the first thin film transistor TFT1 may connect to the front gate line Gi(a) in the ith pixel row and the data line Dj in the jth pixel column. The second thin film transistor TFT2 may connect to the rear gate line Gi(b) in the ith pixel row and the data line Dj+1 in the (j+1) th pixel column.

The sensing line SL1 may be arranged between the adjacent data lines Dj and Dj+1. For example, the sensing line SL may be arranged between the first pixel P1 and the second pixel P2.

The first thin film transistor TFT1 and the second thin film transistor TFT2 may each include a gate electrode GE, a semiconductor active layer SA, a source electrode SE and a drain electrode DE.

The gate electrode GE may connect to one of the gate lines Gi(a) and Gi(b). For example, a gate electrode GE of the first thin film electrode TFT1 may connect to the front gate lines Gi(a) in the ith pixel row, and a gate electrode GE of the second thin film electrode TFT2 may connect to the rear gate line Gi(b) in the ith pixel row. The gate electrode GE may be arranged on the same layer with the gate lines Gi−1(b), Gi(a), Gi(b) and Gi+1(a), for example on the base substrate SUB.

An insulating layer GI may be arranged on the gate lines Gi−1(b), Gi(a), Gi(b) and Gi+1(a) and the gate electrode GE. The gate insulating layer GI may insulate the gate electrode GE and the semiconductor active layer SA. In other words, the gate insulating layer GI may be arranged between the gate electrode GE and the semiconductor active layer SA. The gate insulating layer GI may include one of silicon oxide and silicon nitride. For example, the gate insulating layer GI may have a structure in which an insulating layer including silicon oxide and an insulating layer including silicon nitride are stacked.

The semiconductor active layer SA may be arranged on the gate insulating layer GI. At least a portion of the semiconductor active layer SA may overlap the gate electrode GE. The semiconductor active layer SA may include one of amorphous silicon (a-Si), polycrystalline silicon (p-Si), and an oxide semiconductor. Further, in the semiconductor active layer SA, regions connecting the source electrode SE and the drain electrode DE may be the source region and the drain region in which impurities are doped or injected. A region between the source region and the drain region may be a channel region.

An end portion of the source electrode SE may connect to one end portion of the semiconductor active layer SA, and the other end of the source electrode SE may connect to one of the data lines Dj and Dj+1. For example, the source electrode SE of the first thin film transistor TFT1 may connect to the data line Dj in the jth pixel row, and the source electrode SE of the second thin film transistor TFT2 may connect to the data line Dj+1 in the (j+1) th pixel row The drain electrode DE may connect to the other side of the semiconductor active layer SA, and be arranged to be spaced apart from the source electrode SE.

The data lines Dj and Dj+1 and the sensing line SL may include a semiconductor material layer SCL including a same material as the semiconductor active layer SA, and may also include a conductive layer CL arranged on the semiconductor material layer SCL. The conductive layer CL may include a same material as the source electrode SE and the drain electrode DE.

A thin film transistor TFT having a bottom gate structure in which the gate electrode GE is arranged below the semiconductor active layer SA is illustrated as an example of the thin film transistor TFT, but embodiments of the invention are not limited thereto. For example, the thin film transistor TFT may have a top gate structure in which the gate electrode GE is arranged above the semiconductor active layer SCL.

A first protecting layer PSV1 may be arranged on the base substrate SUB upon which the thin film transistors are arranged. The first protecting layer PSV1 may cover the thin film transistors TFT. The first protecting layer PSV1 may include one of silicon oxide and silicon nitride.

A color filter CF may be arranged on the first protecting layer PSV1. The color filter CF may include an organic solvent comprising an organic insulating material, and a dye or a pigment which is dispersed in the organic solvent to create color. Accordingly, the color filter CF may create color by transmitting or reflecting light from an external source. The color filter CF may be one of a red, green, blue, cyan, magenta, and yellow color filter.

A second protecting layer PSV2 may be arranged on the color filter CF. The second protecting layer PSV2 may include the same material as the first protecting layer PSV1. In other words, the second protecting layer PSV2 may include at least one of silicon oxide and silicon nitride.

The pixels P1 and P2 may be arranged on the second protecting layer PSV2. The pixels P1 and P2 may include a first electrode CE arranged on the second protecting layer PSV2, an electrode insulating layer PSV3 arranged on the first electrode CE, a second electrode PE arranged on the electrode insulating layer PSV3 and connecting to the drain electrode DE through a contact hole, and an optical layer LC transmitting light or not according to an electric field generated by the second electrode PE. The optical layer LC may be a liquid crystal layer including a plurality of liquid crystal molecules.

The first electrode CE may include a transparent conductive oxide. For example, the first electrode CE may include one of Indium Tin Oxide (ITO) and Indium Zinc Oxide (IZO).

In addition, the first electrode CE may include electrode patterns patterned to cover the plurality of pixel regions. The electrode patterns of the first electrode CE may connect to the sensing line SL through the contact hole.

The first electrode CE may receive the common voltage signal through the sensing line SL. Accordingly, the first electrode CE may operate as a common electrode which forms an electric field with the second electrode PE and thereby drives the liquid crystal molecules.

The electrode patterns of the first electrode CE may also receive the touch scan signals through the sensing line SL. Accordingly, when a touch scan signal is applied through the sensing line SL, the first electrode CE may operate as a sensing electrode which senses the touch position of the user. The electrode patterns may thus operate as the sensing electrodes TSE of the touch screen illustrated in FIG. 1.

The electrode insulating layer PSV3 may include a same material as the first protecting layer PSV1. For example, the electrode insulating layer PSV3 may include at least one of silicon oxide and silicon nitride.

The second electrode PE may operate as a pixel electrode which forms the electric field with the first electrode CE and which drives the liquid crystal molecules when the driving signal is applied through the thin film transistors TFT. The second electrode PE may include the same material as the first electrode CE.

As illustrated in FIG. 3, the second electrode PE may include a plurality of branch units PE1 arranged in parallel and spaced apart from one another, and connecting units PE2 connecting both sides of the branch units PE1. One of the connecting units PE2 may connect to the thin film transistor TFT.

In addition, as illustrated in FIGS. 4 and 5, the second electrode PE may include a first electrode unit PEP1 and a second electrode unit PEP2 arranged on both sides of an imaginary reference line (shown as a dashed line in pixel P2 of FIG. 4). The first electrode unit PEP1 and the second electrode unit PEP2 may each include the plurality of branch units PE1 and a connecting unit PE2 connecting at least one side of the branch units PE1.

The branch units PE1 of the first electrode unit PEP1 and the branch units PE1 of the second electrode unit PEP2 may extend in directions inclined from the reference line. For example, the branch units PE1 of the first electrode unit PEP1 and the branch units PE1 of the second electrode unit PEP2 may extend in directions symmetric with respect to the reference line.

As illustrated in FIG. 4, the branch units PE1 of the first electrode unit PEP1 and the branch units PE1 of the second electrode unit PEP2 may be separated from each other, i.e. may occupy different portions of their pixel.

As illustrated in FIG. 5, the branch units PE1 of the first electrode unit PEP1 and the branch units PE1 of the second electrode unit PEP2 may be separated from each other. In addition, the first electrode unit PEP1 and the second electrode unit PEP2 of the second electrode PE may each have a shape inclined with respect to the reference line. The data lines Dj and Dj+1 and the sensing line SL may have a bent shape corresponding to bends in the first electrode unit PEP1 and the second electrode unit PEP2.

For example, the data lines Dj and Dj+1 and the sensing line SL may include a first slope IP1 inclined corresponding to the first electrode unit PEP1, a second slope IP2 inclined corresponding to the second electrode PEP2, and a planar unit FP that is not inclined, i.e. that does not have the first slope IP1 or the second slope IP2.

The second substrate 120 may be opposite to the first substrate 110, and may be attached to the first substrate 110 through a sealant. The second substrate 120 may include the same material as the first substrate 110.

In the display device, the first electrode CE may be the sensing electrode of the touch screen. Accordingly, compared to a display device including the touch screen attached a surface of the display panel 100, a display device of embodiments of the invention may be thinner.

Hereafter, other embodiments of the present disclosure are presented in FIGS. 9 to 14. Referring to FIGS. 9 to 14, even though shown on different drawings, like reference numerals refer to like elements throughout, and a brief description follows. In addition, referring to FIGS. 9 to 14, only differences from FIGS. 1 to 8 will primarily be described, in order to avoid duplicate explanation.

Figure 9:
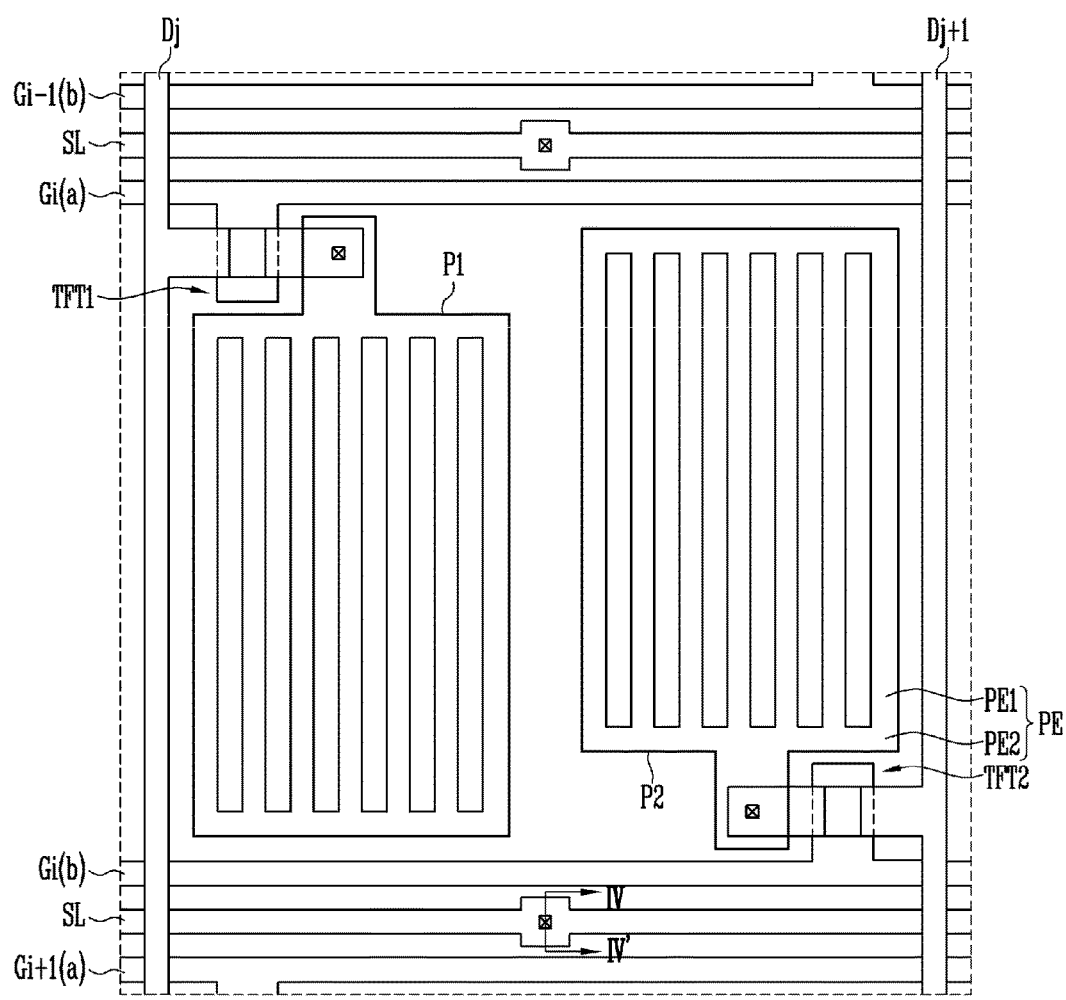
FIG. 9 is a partial plan view illustrating a display device according to another embodiment.
Figure 10:
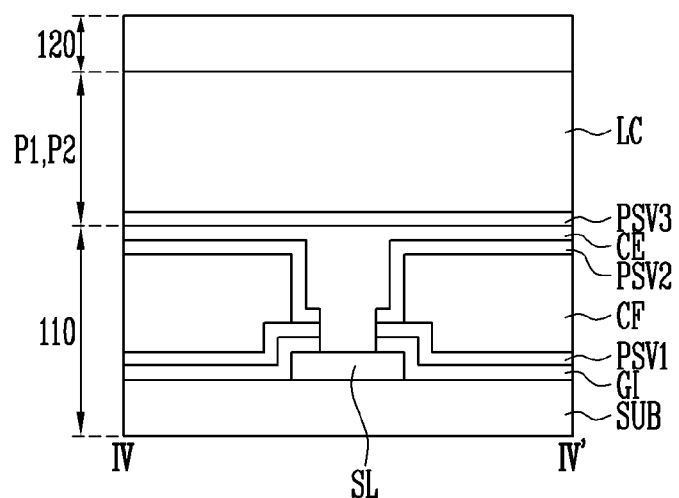
FIG. 10 is a cross sectional view taken along line IV-IV' in FIG. 9.

FIG. 9 is a partial plan view illustrating a display device according to an embodiment, and FIG. 10 is a cross sectional view taken along line IV-IV' in FIG. 9.

Referring to FIGS. 1, 2, 9 and 10, the display panel 100 may include the first substrate 110, the second substrate 120 opposite to the first substrate 110, and a plurality of pixels, e.g. pixels P1 and P2, arranged between the first substrate 110 and the second substrate 120, for example. The first pixel P1 and the second pixel P2 may be arranged in the same row.

The first substrate 100 may include the base substrate SUB and the thin film transistors TFT arranged on the base substrate SUB. The thin film transistors TFT may include the first thin film transistor TFT1 connecting the first pixel P1 and the second thin film transistor TFT2 connecting the second pixel P2.

In addition, the gate lines Gi−1(b), Gi(a), Gi(b) and Gi+1(a), and the data lines Dj and Dj+1 intersecting the gate lines Gi−1(b), Gi(a), Gi(b) and Gi+1(a), are arranged on the base substrate SUB.

The gate lines Gi−1(b), Gi(a), Gi(b) and Gi+1(a) may include the front gate lines Gi(a) and Gi+1(a) and the rear gate lines Gi−1(b) and Gi(b).

The first thin film transistor TFT1 and the second thin film transistor TFT2 may connect to one of the gate lines Gi−1(b), Gi(a), Gi(b) and Gi+1(a) and one of the data lines Dj and Dj+1, respectively. For example, the first thin film transistor TFT1 may connect to the front gate line Gi(a) in the ith pixel row and the data line Dj in the jth pixel column. The second thin film transistor TFT2 may connect to the rear gate line Gi(b) in the ith pixel row and the data line Dj+1 in the (j+1) th pixel column.

In addition, the sensing line SL may be arranged between the rear gate line Gi(b) in the ith pixel row and the front gate line Gi+1(a) in the (i+1)th pixel row. The sensing line SL is parallel with the gate lines Gi−1(b), Gi(a), Gi(b) and Gi+1(a). The sensing line SL may be arranged on the same layer as the gate lines Gi−1(b), Gi(a), Gi(b) and Gi+1(a), for example, on the base substrate SUB.

The first pixel P1 and the second pixel P2 may be arranged between the data lines Dj and Dj+1.

The pixels P1 and P2 may include a first electrode CE arranged on the second protecting layer PSV2, an electrode insulating layer PSV3 arranged on the first electrode CE, a second electrode PE arranged on the electrode insulating layer PSV3 and connecting the drain electrode DE through a contact hole, and the optical layer LC transmitting light according to the electric field generated by the second electrode PE.

The first electrode CE may connect to the sensing line SL through the contact hole. The first electrode CE may receive the common voltage signal through the sensing line SL. Accordingly, the first electrode CE may operate as the common electrode which forms an electric field and drives the liquid crystal molecules.

In addition, the first electrode CE may receive the touch scan signal through the sensing line SL. Accordingly, when the touch scan signal is applied through the sensing line SL, the first electrode CE may operate as the sensing electrode which senses the touch position of the user.

Figure 11:
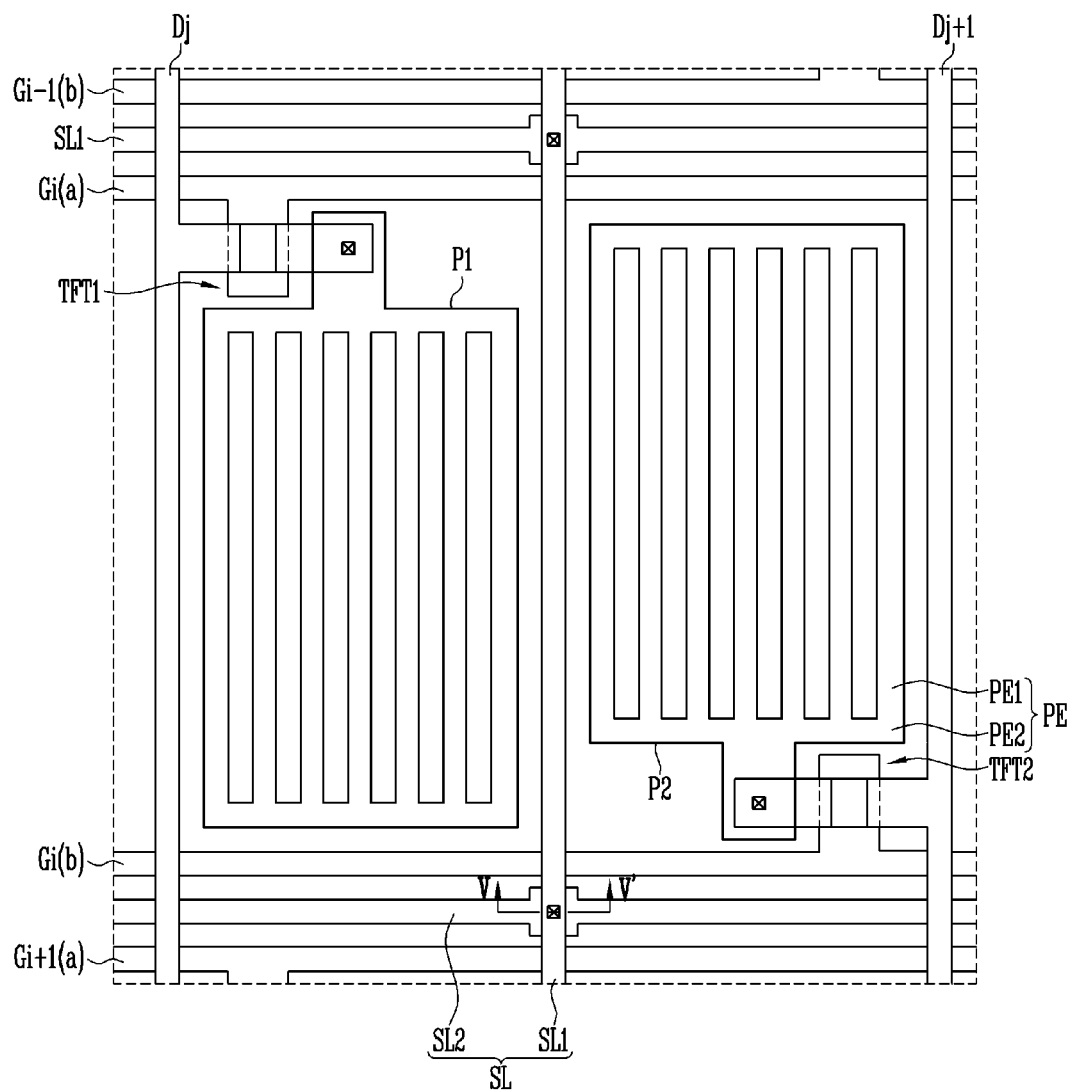
FIG. 11 is a partial plan view illustrating a display device according to another embodiment.
Figure 12:
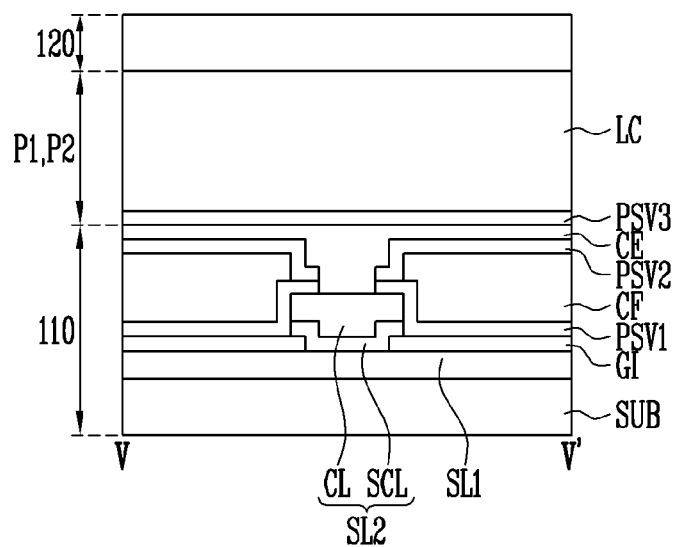
FIG. 12 is a cross sectional view taken along line V-V' in FIG. 11.

FIG. 11 is a partial plan view illustrating a display device according to another embodiment, and FIG. 12 is a cross sectional view taken along line V-V' in FIG. 11.

Referring to FIGS. 1, 2, 11, and 12, the display panel 100 may include the first substrate 110, the second substrate 120 opposite to the first substrate 110, and a plurality of pixels such as pixels P1 and P2 arranged between the first substrate 110 and the second substrate 120. The first pixel P1 and the second pixel P2 may be arranged in the same pixel row.

The first substrate 100 may include the base substrate SUB and the thin film transistors TFT arranged on the base substrate SUB. The thin film transistors TFT may include the first thin film transistor TFT1 connecting the first pixel P1 and the second thin film transistor TFT2 connecting the second pixel P2.

The gate lines Gi−1(b), Gi(a), Gi(b) and Gi+1(a), and the data lines Dj and Dj+1 intersecting the gate lines Gi−1(b), Gi(a), Gi(b) and Gi+1(a), are arranged on the base substrate SUB.

The gate lines Gi−1(b), Gi(a), Gi(b) and Gi+1(a) may include the front gate lines Gi(a) and Gi+1(a) and the rear gate lines Gi−1(b) and Gi(b).

The first thin film transistor TFT1 and the second thin film transistor TFT2 may connect to one of the gate lines Gi−1(b), Gi(a), Gi(b) and Gi+1(a) and one of the data lines Dj and Dj+1, respectively. For example, the first thin film transistor TFT1 may connect to the front gate line Gi(a) in the ith pixel row and the data line Dj in the jth pixel column. The second thin film transistor TFT2 may connect to the rear gate line Gi(b) in the ith pixel row and the data line Dj+1 in the (j+1) th pixel column.

The first pixel P1 and the second pixel P2 may be arranged between the data lines Dj and Dj+1, and adjacent to each other The sensing lines SL may include the first sensing line SL1 and the second sensing line SL2. The first sensing line SL1 may be electrically connected to the second sensing line SL2.

In addition, the first sensing line SL1 may be arranged between the rear gate line Gi(b) in the ith pixel row and the front gate line Gi+1(a) in the (i+1)th pixel row. The first sensing line SL1 is parallel with the gate lines Gi−1(b), Gi(a), Gi(b) and Gi+1(a). The first sensing line SL1 may be arranged on the same layer as the gate lines Gi−1(b), Gi(a), Gi(b) and Gi+1(a), for example, on the base substrate SUB.

The second sensing line SL2 may be arranged between the adjacent data lines Dj and Dj+1. For example, the second sensing line SL2 may be arranged between the first pixel P1 and the second pixel P2.

The pixels P1 and P2 may include a first electrode CE arranged on the second protecting layer PSV2, an electrode insulating layer PSV3 arranged on the first electrode CE, a second electrode PE arranged on the electrode insulating layer PSV3 and connecting the drain electrode DE through a contact hole, and the optical layer LC transmitting or intercepting light according to the electric field generated by the second electrode PE.

The first electrode CE may connect to the sensing lines SL1, SL2 through the contact hole. The first electrode CE may receive the common voltage signal through the second sensing line SL2. Accordingly, the first electrode CE may operate as the common electrode which forms an electric field and drives the liquid molecules when the common voltage signal is applied through the second sensing line SL2.

In addition, the first electrode CE may receive the touch scan signal through the sensing line SL, for example, the first sensing line SL1. Accordingly, when the touch scan signal is applied through the sensing line SL, the first electrode CE may operate as a sensing electrode which senses the touch position of the user.

Figure 13:
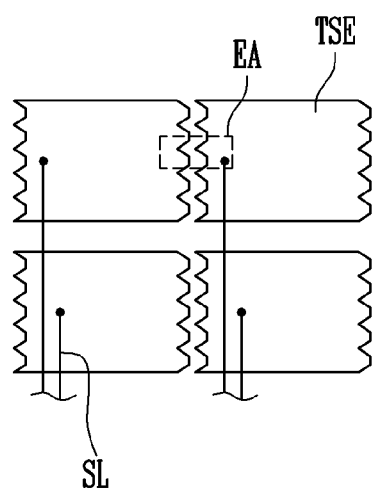
FIG. 13 is a plan view illustrating partial electrodes according to the other embodiment.
Figure 14:
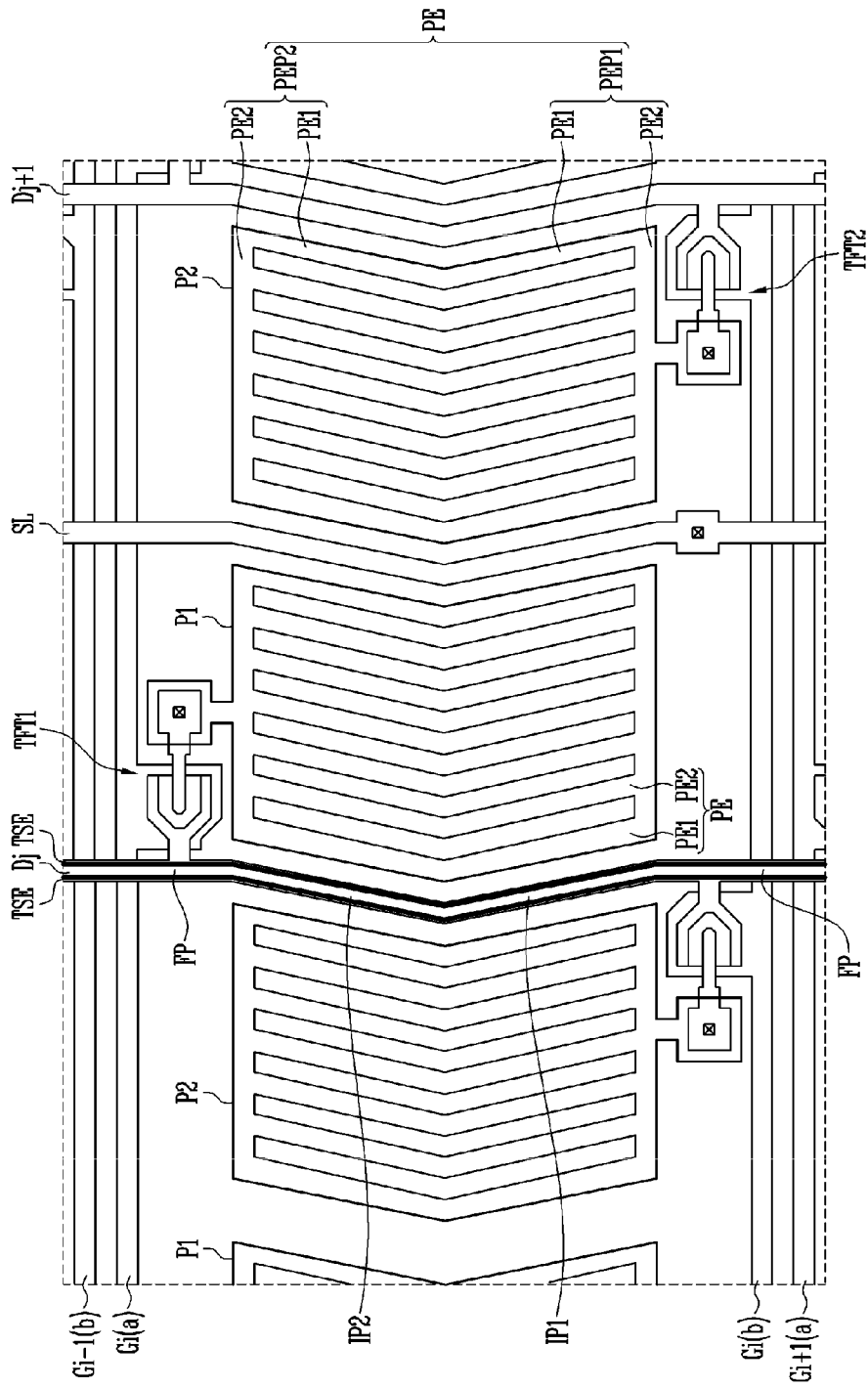
FIG. 14 is an enlarged view of area EA in FIG. 13.

FIG. 13 is a plan view illustrating partial electrodes according to the other embodiment, and FIG. 14 is an enlarged view of area EA in FIG. 13.

Referring to FIGS. 1, 2, 13, and 14, the display panel 100 may include the first substrate, the second substrate and the plurality of the pixels P1 and P2 arranged between the first substrate and the second substrate. One of the first substrate and the second substrate may include the plurality of gate lines Gi−1(b), Gi(a), Gi(b) and Gi+1(a) and the data lines Dj and Dj+1 intersecting the gate lines Gi−1(b), Gi(a), Gi(b) and Gi+1(a). One of these substrates may also include the plurality of thin film transistors, e.g. TFT1 and TFT2, connected to the data lines Dj and Dj+1. Each of the pixels P1 and P2 may connect to one of the thin film transistors TFT1 and TFT2.

The pixels P1 and P2 may include the first electrode, the second electrode PE and the liquid crystal layer transmitting light according to the electric field formed by the first and second electrodes.

One of the first and second electrodes PE, for example the first electrode, may receive the common voltage signal to formed the electric field. In addition, the first electrode may include the electrode pattern to be patterned to cover the plurality of pixel regions. The pixel regions may be the regions in which the pixels are arranged, respectively. In addition, the electrode patterns may be the sensing electrodes TSE of the touch screen.

The sensing electrodes TSE may have a polygon shape, for example a square shape. In addition, the sensing electrodes TSE may connect to the touch driving unit 200 through the sensing lines SL. Accordingly, the sensing electrodes TSE may sense the touch position of the user when the touch scan signals are applied through the sensing lines SL.

One of the first electrode and the second electrode PE, for example the second electrode PE, may connect to the thin film transistor TFT1 and TFT2 and receive the driving signal.

The second electrode PE may include the first electrode unit PEP1 and the second electrode unit PEP2 arranged on both sides of a reference line. The first electrode PEP1 and the second electrode PEP2 may include a plurality of branch units PE1, and the connecting units PE2 connecting at least one side of the branch units PE1

The branch units PE1 of the first electrode unit PEP1 and the branch units PE1 of the second electrode unit PEP2 may extend in a direction inclined with respect to the reference line. For example, the branch units PE1 of the first electrode unit PEP1 and the branch units PE1 of the second electrode unit PEP2 may extend in directions symmetric with respect to the reference line.

As illustrated in FIG. 5, the branch units PE1 of the first electrode unit PEP1 and the branch units PE1 of the second electrode unit PEP2 may be connected to each other. In addition, the first electrode unit PEP1 and the second electrode unit PEP2 of the second electrode PE may have a shape whose outer edges are inclined with respect to the reference line. The data lines Dj and Dj+1 and the sensing line SL may be bent to correspond to the angles of inclination of the first electrode unit PEP1 and the second electrode unit PEP2.

For example, the data lines Dj and Dj+1 and the sensing line SL may have sections inclined at a first slope IP1 corresponding to the first electrode unit PEP1, a second slope IP2 corresponding to the second electrode PEP2, and straight or vertical portions connecting the inclined sections.

At least one side of the sensing electrodes TSE, for example sides corresponding to the data lines Dj and Dj+1, may include a zigzag shape. A region corresponding the first slope IP1 of the sides corresponding to the data lines Dj and Dj+1 may be parallel with the first slope IP1. A region corresponding the second slope IP2 of the sides corresponding to the data lines Dj and Dj+1 may be parallel with the second slope IP2. A region corresponding to straight sections of the data lines Dj and Dj+1 may also be straight.

In addition, the sides corresponding to the data lines Dj and Dj+1 may overlap the data lines Dj and Dj+1. Accordingly, a distance between adjacent sensing electrodes TSE may be smaller than a width of the data lines Dj and Dj+1. When the sides corresponding to the data lines Dj and Dj+1 of the sensing electrodes TSE may overlap the data lines Dj and Dj+1, light-leakage in areas covered by the sensing electrodes TSE may be prevented.

As described above, the display device may include elements constituting a touch screen within a display panel. In addition, since one of the electrodes of a pixel may also act as a touch sensing electrode, a slimmer display device may result.

Embodiments are provided to more sincerely and fully disclose the invention and to completely transfer the spirit of the invention to those skilled in the art to which the invention pertains, and the scope of the invention should be understood by the claims of the invention. Accordingly, it will be understood by those of skill in the art that various changes in form and details may be made without departing from the spirit and scope of the invention as set forth in the following claims. Accordingly, it will be understood by those of skill in the art that various changes in form and details may be made without departing from the spirit and scope of the present invention as set forth in the following claims. Therefore, the technical range of the present invention is not limited to the detailed description of the specification but defined by the range of the claims. Various features of the above described and other embodiments can be mixed and matched in any manner, to produce further embodiments consistent with the invention.

What is claimed is:

1. A display device, comprising:
   a substrate;
   a plurality of gate lines on the substrate;
   a plurality of data lines intersecting the gate lines on the substrate;
   a plurality of thin film transistors each connected to one of the gate lines and one of the data lines;
   a color filter disposed on the thin film transistors;
   an insulating layer covering the thin film transistors and interposed between the color filter and the thin film transistors;
   a first electrode;
   a protecting layer formed of an insulating material and positioned between the first electrode and the color filter;
   a plurality of pixels each including a portion of the first electrode and including a second electrode insulated from the first electrode and connected to one of the thin film transistors, wherein the pixels are arranged in a matrix configuration including a plurality of pixel rows extending parallel with the gate lines and a plurality of pixel columns extending parallel with the data lines; and
   a plurality of sensing lines connected to the first electrodes, wherein the gate lines include front gate lines and rear gate lines arranged at a front and a rear of each of respective pixel rows, and a rear gate line of a front pixel row and a front gate line of a rear pixel row are arranged between adjacent pixel rows, and two pixel columns are arranged between adjacent data lines,
   wherein the first electrode is disposed on each of the thin film transistors and comprises a plurality of sensing electrodes electrically connected to a corresponding sensing line and associated with at least one of the pixels, wherein the first electrode is disposed between the color filter and a first portion of the second electrode, wherein a second portion of the second electrode is positioned inside a hole of the insulating layer and is positioned between two opposite portions of the protecting layer, wherein each of the two opposite portions of the protecting layer directly contacts the insulating layer, and wherein a material of the first portion of the second electrode is identical to a material of the second portion of the second electrode.

2. The display device of claim 1, wherein the sensing lines are oriented substantially parallel with at least one of the data lines and the gate lines.

3. The display device of claim 2, wherein the sensing lines are oriented substantially parallel with the data lines and each arranged between two adjacent pixel columns.

4. The display device of claim 3, wherein the sensing lines and the gate lines are alternately arranged.

5. The display device of claim 3, wherein the second electrode comprises a plurality of branch units arranged and spaced apart from one another, and connecting units connecting both sides of the branch units.

6. The display device of claim 3, wherein the second electrode comprises a first electrode unit and a second electrode unit arranged on opposing sides of an imaginary reference line, and the first electrode unit and the second electrode unit each comprise a plurality of branch units and a connecting unit connecting at least one side of the branch units.

7. The display device of claim 6, wherein the branch units of the first electrode unit and the branch units of the second electrode unit extend in a direction inclined with respect to the reference line.

8. The display device of claim 7, wherein the first electrode unit and the second electrode unit have an edge inclined with respect to the reference line.

9. The display device of claim 8, wherein the data lines and the sensing lines comprise a first portion oriented corresponding to the first electrode unit and a second portion oriented corresponding to the second electrode.

10. The display device of claim 9, wherein the data lines and the sensing lines further comprise a straight line unit oriented substantially perpendicular to at least one of the gate lines.

11. The display device of claim 9, wherein the sensing electrodes cover a plurality of pixel regions.

12. The display device of claim 11, wherein sides of the sensing electrodes are oriented substantially parallel to corresponding sides of corresponding data lines.

13. The display device of claim 12, wherein the data lines and the sensing lines each have portions oriented substantially perpendicular to at least one of the gate lines.

14. The display device of claim 13, wherein the sensing electrodes at least partially overlap the data lines.

15. The display device of claim 2, wherein the sensing lines are oriented substantially parallel with the gate lines.

16. The display device of claim 15, wherein ones of the sensing lines are arranged between the rear gate line in each front pixel row and the front gate line in the adjacent rear pixel row.

17. The display device of claim 2, wherein the sensing lines comprise a first sensing line oriented parallel with the gate lines and a second sensing line connected to the first sensing line and oriented parallel with the data lines.

18. The display device of claim 17, wherein the first sensing line is arranged between the rear gate line of one of the front pixel rows and the front gate line of the corresponding rear pixel row.

19. The display device of claim 17, wherein the second sensing lines are arranged on a same layer as the data lines and arranged between adjacent pixel columns.

20. The display device of claim 1, wherein two sides of two adjacent sensing electrodes of the sensing electrodes are positioned between two opposite sides of a first data line of the data lines in a direction parallel to a first gate line of the gate lines in a plan view of the display device.

21. The display device of claim 1, wherein:
the first electrode operates as a common electrode when a common voltage signal is applied through a corresponding sensing line, and
the first electrode operates as a touch electrode when a touch scan signal is applied through the corresponding sensing line.

22. A display device, comprising:
a first substrate including a base substrate, a plurality of gate lines arranged on the base substrate, a plurality of data lines intersecting the gate lines, a plurality of sensing lines arranged on a same layer as at least one of the gate lines and the data lines, and a plurality of thin film transistors connecting to respective ones of the gate lines and ones of the data lines;
a color filter disposed on the thin film transistors;
an insulating layer covering the thin film transistors and interposed between the color filter and the thin film transistors;
a first electrode;
a protecting layer formed of an insulating material, positioned between the first electrode and the color filter, and directly contacting at least two sides of the color filter that are directly connected to each other and are not aligned with each other;
a second substrate opposite the first substrate; and
a plurality of pixels arranged in a matrix configuration including a plurality of pixel rows oriented substantially parallel with the gate lines and a plurality of pixel columns oriented substantially parallel with the data lines, the pixels being positioned between the first substrate and the second substrate,
wherein each of the pixels comprises:
a portion of the first electrode connected to one of the sensing lines;
an electrode insulating layer arranged on the first electrode;
a second electrode arranged on the electrode insulating layer and connected to one of the thin film transistors; and
an optical layer between the first electrode and the second electrode, wherein the gate lines include front gate lines and rear gate lines arranged at a front and a rear of each of respective pixel rows, and a rear gate line of a front pixel row and a front gate line of a rear pixel row are arranged between adjacent pixel rows, and two pixel columns are arranged between adjacent data lines,
wherein the first electrode is disposed on each of the thin film transistors comprises a plurality of sensing electrodes electrically connected to a corresponding sensing line and associated with at least one of the pixels,
wherein the first electrode is disposed between the color filter and the second electrode, and wherein a portion of the second electrode includes a transparent conductive material and is positioned inside a hole of the insulating layer.

23. The display device of claim 22, wherein the sensing lines are arranged on a same layer as the data lines and oriented parallel with the data lines, and each arranged between adjacent two pixel columns.

24. The display device of claim 23, wherein the sensing lines and the data lines are alternately arranged.

25. The display device of claim 23, wherein the second electrode comprises a first electrode unit and a second electrode unit arranged on opposing sides of an imaginary reference line, and the first electrode and the second electrode each comprise a plurality of branch units and a connecting unit connecting at least some of the branch units.

26. The display device of claim 25, wherein the branch units of the first electrode unit and the branch units of the second electrode unit extend in a direction inclined with respect to the reference line.

27. The display device of claim 26, wherein the first electrode unit and the second electrode have an edge inclined with respect to the reference line.

28. The display device of claim 27, wherein the data lines and the sensing lines comprise: a first portion oriented corresponding to the first electrode unit and a second portion oriented corresponding to the second electrode.

29. The display device of claim 28, wherein the sensing electrodes cover a plurality of pixel regions.

30. The display device of claim 29, wherein sides of the sensing electrodes are oriented substantially parallel to corresponding sides of corresponding data lines.

31. The display device of claim 30, wherein the sensing electrodes at least partially overlap the data lines.

32. The display device of claim 22, wherein the sensing lines are arranged in a same layer as the gate lines, and oriented parallel with the gate lines.

33. The display device of claim 32, wherein ones of the sensing lines are arranged between the rear gate line in each front pixel row and the front gate line in the adjacent rear pixel row.

34. The display device of claim 22, wherein the sensing lines comprise: a first sensing line oriented parallel with the gate lines, and a second sensing line connected to the first sensing line and oriented parallel with the data lines.

35. The display device of claim 34, wherein the first sensing line is arranged on a same layer as the gate lines and between the rear gate line in one of the front pixel rows and the front gate line in the corresponding rear pixel row.

36. The display device of claim 34, wherein the second sensing lines are arranged on a same layer as the data lines and between adjacent pixel columns.

37. The display device of claim 22, wherein the second electrode comprises: a plurality of branch units arranged and spaced apart from one another, and connecting units connecting both sides of the branch units.

38. The display device of claim 22, wherein a distance between two adjacent sensing electrodes of the sensing electrodes is smaller than a width of a first data line of the data lines in a direction parallel to a first gate line of the gate lines in a plan view of the display device.

39. The display device of claim 22, wherein:
the first electrode operates as a common electrode when a common voltage signal is applied through a corresponding sensing line, and
the first electrode operates as a touch electrode when a touch scan signal is applied through the corresponding sensing line.

* * * * *